(12) United States Patent
Tran (10) Patent No.: US 11,862,924 B2
(45) Date of Patent: Jan. 2, 2024

(54) LOW NOISE LASERS WITH RESONATOR FILTERS

(71) Applicant: Minh Tran, Goleta, CA (US)

(72) Inventor: Minh Tran, Goleta, CA (US)

( * ) Notice: Subject to any disclaimer, the term of this patent is extended or adjusted under 35 U.S.C. 154(b) by 296 days.

(21) Appl. No.: 17/128,154

(22) Filed: Dec. 20, 2020

(65) Prior Publication Data

US 2022/0200228 A1 Jun. 23, 2022

(51) Int. Cl.
| | | |
|---|---|---|
| *H01S 3/00* | (2006.01) | |
| *H01S 3/10* | (2006.01) | |
| *H01S 3/063* | (2006.01) | |
| *H01S 5/14* | (2006.01) | |
| *H01S 3/081* | (2006.01) | |

(52) U.S. Cl.
CPC .......... *H01S 3/1003* (2013.01); *H01S 3/0078* (2013.01); *H01S 3/063* (2013.01); *H01S 5/143* (2013.01); *H01S 3/081* (2013.01)

(58) Field of Classification Search
None
See application file for complete search history.

(56) References Cited

U.S. PATENT DOCUMENTS 9,537,283 B2 * 1/2017 Strandjord ............ H01S 3/1304

FOREIGN PATENT DOCUMENTS

| CN | 102377098 B | * | 9/2015 | ............... H01S 5/12 |
| CN | 111613959 A | * | 9/2020 | ........... H01S 3/1067 |

* cited by examiner

*Primary Examiner* — Mark Hellner
(74) *Attorney, Agent, or Firm* — Shalini Venkatesh (57) ABSTRACT

A device comprises three elements. The first element, comprising an optical gain structure and a laser cavity mirror structure, couples light to the second element, comprising a phase tuner. The second element couples phase tuned light to the third element. The third element, comprising an optical resonator with first and second coupler/splitter structures, provides a primary optical output from the second coupler/splitter structure. Light coupled into the optical resonator through the first coupler/splitter structure and then coupled out of the optical resonator though the first coupler/splitter structure is injected back into the optical gain structure through the second element. Light coupled out of the optical resonator through the second coupler/splitter structure is provided as the primary optical output. Characteristic of the coupler/splitter structures and the optical resonator are selected such that the light injected back into the optical gain structure reduces linewidth, and noise in primary optical output is suppressed.

18 Claims, 8 Drawing Sheets

LOW NOISE LASERS WITH RESONATOR FILTERS

CROSS REFERENCE TO RELATED APPLICATION

This application is related to U.S. application Ser. Nos. 16/254,883 and 16/677,050, issued as U.S. Pat. Nos. 10,718,898 and 10,641,959 respectively, which are hereby incorporated by reference as if set forth in full in this application for all purposes.

FIELD OF THE INVENTION

The present invention relates to optical sources. More specifically, certain embodiments of the invention relate to low noise semiconductor lasers with improved performance.

BACKGROUND OF THE INVENTION

Semiconductor lasers are solid-state lasers based on semiconductor gain media. Most semiconductor lasers are laser diodes, which are pumped with an electrical current in a region where n-doped and p-doped semiconductor material meet. However, there are also optically pumped semiconductor lasers, where carriers are generated by absorbed pump light, and quantum cascade lasers, where intra-band transitions are utilized.

Common materials for semiconductor lasers (and for other optoelectronic devices) are: GaAs (gallium arsenide), AlGaAs (aluminum gallium arsenide), GaP (gallium phosphide), InGaP (indium gallium phosphide), GaN (gallium nitride), InGaAs (indium gallium arsenide), GaInNAs (indium gallium arsenide nitride), InP (indium phosphide), GaInP (gallium indium phosphide) or others. These are all direct bandgap semiconductors; indirect bandgap semiconductors such as silicon do not exhibit strong and efficient light emission.

Semiconductor lasers or laser diodes play an important part in our everyday lives by providing cheap and compact lasers used for various applications such as optical communications, sensing, displays, lighting, material processing and others. Their typical size is in the order of mm, they are made up of complex multi-layer structures requiring nanometer scale accuracy, and are carefully and elaborately designed for best performance.

Some key parameters of semiconductor lasers are output power, threshold current, wall-plug efficiency, wavelength of operation, beam quality and others, depending on application. In some applications, important metrics of laser are related to noise: phase/frequency noise and relative intensity noise (RIN). An ideal laser, due to the nature of stimulated emission, would have zero phase/frequency noise as each created photon would have identical phase, frequency, polarization, and direction to the photon of the incident wave. In reality, due to spontaneous emission that is ongoing in parallel to the stimulated emission process, the phase is slightly perturbed. The effects are further enhanced by other external effects such as carrier fluctuations, thermal fluctuations and other sources of noise resulting in phase/frequency increase and laser linewidth broadening. Similarly, amplitude noise, commonly specified as RIN, arises due to cavity vibration, fluctuation in gain medium, noise transferred from pump source, etc. Both types of noise have frequency dependent characteristics with the level of noise typically being highest at low-frequencies (1/f, 1/(f^2), etc. type) and at or near the lasers' relaxation oscillation frequency.

The frequency dependent noise in a semiconductor laser determines the laser linewidth at various observation time scales. Typically, linewidth observed over a short observation time (so called "instantaneous linewidth") is mostly affected by high frequency noise. As observation time increases, the laser linewidth (so called "integrated linewidth") increases due to dominantly 1/f characteristics of frequency dependent noise, thermal noise and other technical noise in low frequency range. Semiconductor lasers typically have linewidths in the order of 100 kHz to few MHz, making them much narrower in terms of linewidth than e.g. LED sources or thermal sources.

Many applications require or can benefit from a further reduction in linewidth including e.g. communication systems (especially coherent communication systems using higher-order modulation formats), various sensing applications including precise timing, atom manipulation, frequency-modulated continuous-wave (FMCW) LIDAR, spectroscopy and others, radio-frequency RF photonic systems, frequency generators based on semiconductor lasers, etc. Some other types of lasers, including fiber or gas-based lasers, can provide lower linewidth but at the expense of size, weight, power, cost (SWaP-C), and other important characteristics, making them unsuitable for many applications.

There remains a need for compact, low noise semiconductor lasers to address the requirements of current and future systems while preserving the SWaP-C advantages commonly enabled by current, relatively large-linewidth semiconductor lasers. The ability to support additional functionality is also desirable.

DETAILED DESCRIPTION

Embodiments described herein are directed to the realization of low noise lasers in photonic integrated circuits with improved performance and additional functionality over currently available devices.

In the following detailed description, reference is made to the accompanying drawings which form a part hereof, wherein like numerals designate like parts throughout, and in which are shown by way of illustration embodiments in which the subject matter of the present disclosure may be practiced. It is to be understood that other embodiments may be utilized and structural or logical changes may be made without departing from the scope of the present disclosure. Therefore, the following detailed description is not to be taken in a limiting sense, and the scope of embodiments is defined by the appended claims and their equivalents.

The description may use perspective-based descriptions such as top/bottom, in/out, over/under, and the like. Such descriptions are merely used to facilitate the discussion and are not intended to restrict the application of embodiments described herein to any particular orientation. The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B and C).

A photonic integrated circuit (PIC) or integrated optical circuit is a device that integrates multiple photonic functions and as such is analogous to an electronic integrated circuit.

The term "coupled with," along with its derivatives, may be used herein. "Coupled" may mean one or more of the following. "Coupled" may mean that two or more elements are in direct physical, electrical, or optical contact. However, "coupled" may also mean that two or more elements indirectly contact each other, but yet still cooperate or interact with each other, and may mean that one or more other elements are coupled or connected between the elements that are said to be coupled with each other.

Figure 1:
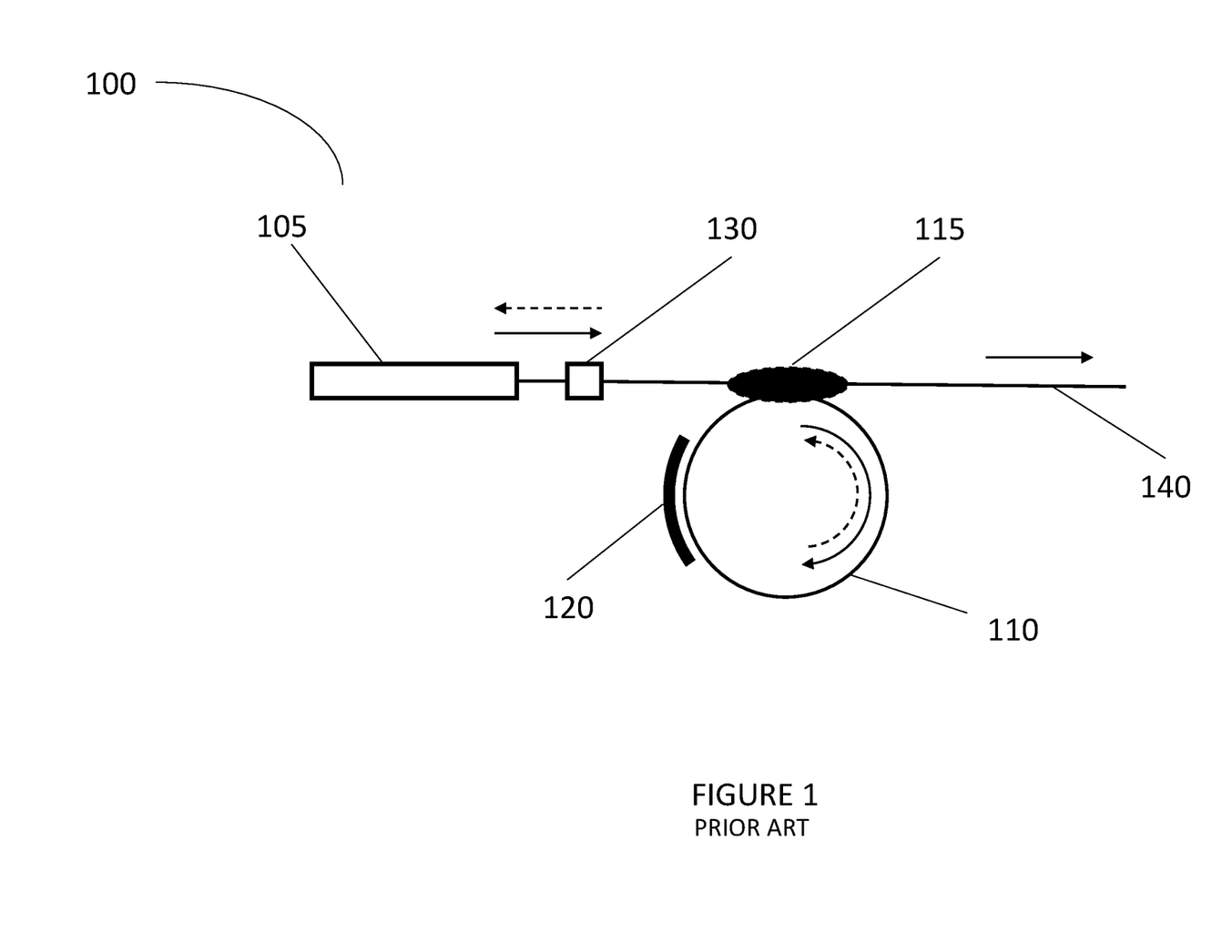
FIG. 1 shows a top-down view of a prior art device.

FIG. 1 (prior art) shows a top-down view of a semiconductor laser 105 that is stabilized by injection-locking to a high-quality factor (high-Q) resonator 110 providing low noise semiconductor laser 100. The forward propagating (as indicated by solid-line arrows) light from laser 105 passes through phase control 130 (to be described in more detail below) and coupler/splitter 115 before emerging as output 140. Part of the light is coupled via coupler/splitter 115 to the resonator 110. This resonator can be a circular resonator (e.g. micro-ring, micro-disk, micro-sphere, toroid, rod) or other type of resonator. Such resonators are typically characterized by the quality factor Q, where higher Q signifies a higher-quality resonator. The Q factor can be defined in multiple ways, one of which is determined in terms of the relative linewidth of the resonance as follows: the Q factor is the ratio of the resonance frequency $v_0$ and the full width at half-maximum (FWHM) bandwidth $\delta v$ of the resonance. We define high-Q resonators as resonators whose Q value exceeds 1M (million), with best performing resonators achieving Q>1 B (billion). A small part of laser 105's output is coupled via 115 to resonator 110. Resonator 110 is also defined by a roundtrip time, i.e. time needed for light to make one full roundtrip. During each cycle of propagation around resonator 110, light accumulates phase, and at certain frequencies (corresponding to resonances) the phase of new incoming light combines coherently with the light that has already made one or more roundtrips inside the resonator. This can lead to significant power buildup and storing of coherent photons.

Each waveguide linking or making up elements of laser 100 is characterized by some level of scattering, either due to material itself or processing related roughness, and such scattering causes loss. Part of the scattered light is coupled into the waveguide, but may have the opposite direction of propagation, as suggested in the figure by dashed-line arrow. Even though in a high-Q resonator, such scattering and loss are generally low, due to the high-power buildup at resonance wavelengths, the backscattered power can be significant. Such filtered, back-scattered light can be injected back into the laser 105, effectively stabilizing it, improving both the RIN and phase/frequency noise. For best performance, the operating frequency of the laser 105 and the resonant frequency of the high-Q resonator 110 have to be controlled and adjusted properly, which can be done either on the laser end using current injection, thermal and/or other mechanisms of tuning generally employed in semiconductor lasers, or at the resonator. In the case where adjustment is done by tuning the resonator, a suitable tuning element 120 can be incorporated. Such tuning mechanisms can be thermal, electro-optical, strain/stress based and/or others.

As the laser is sensitive to the phase of the backscattered light providing feedback, another phase tuning element 130 is typically introduced. Phase tuning element 130 can be a discrete tuning element as shown in FIG. 1, or it can be a part of the laser 105. Various tuning elements can be utilized, depending on the exact way the whole apparatus is made. If components are free space based, then the phase tuning can be obtained by controlling the distance between elements. If components are fiber coupled, then the phase tuning element can be piezo based, thermal, and/or some other type of fiber coupled phase tuner. In the case where the functionality of 100 is at least partly made in a PIC, then the tuning element can be any type of common phase tuning element used in PICs such as thermal, carrier, electro-optic based and/or others.

Figure 2:
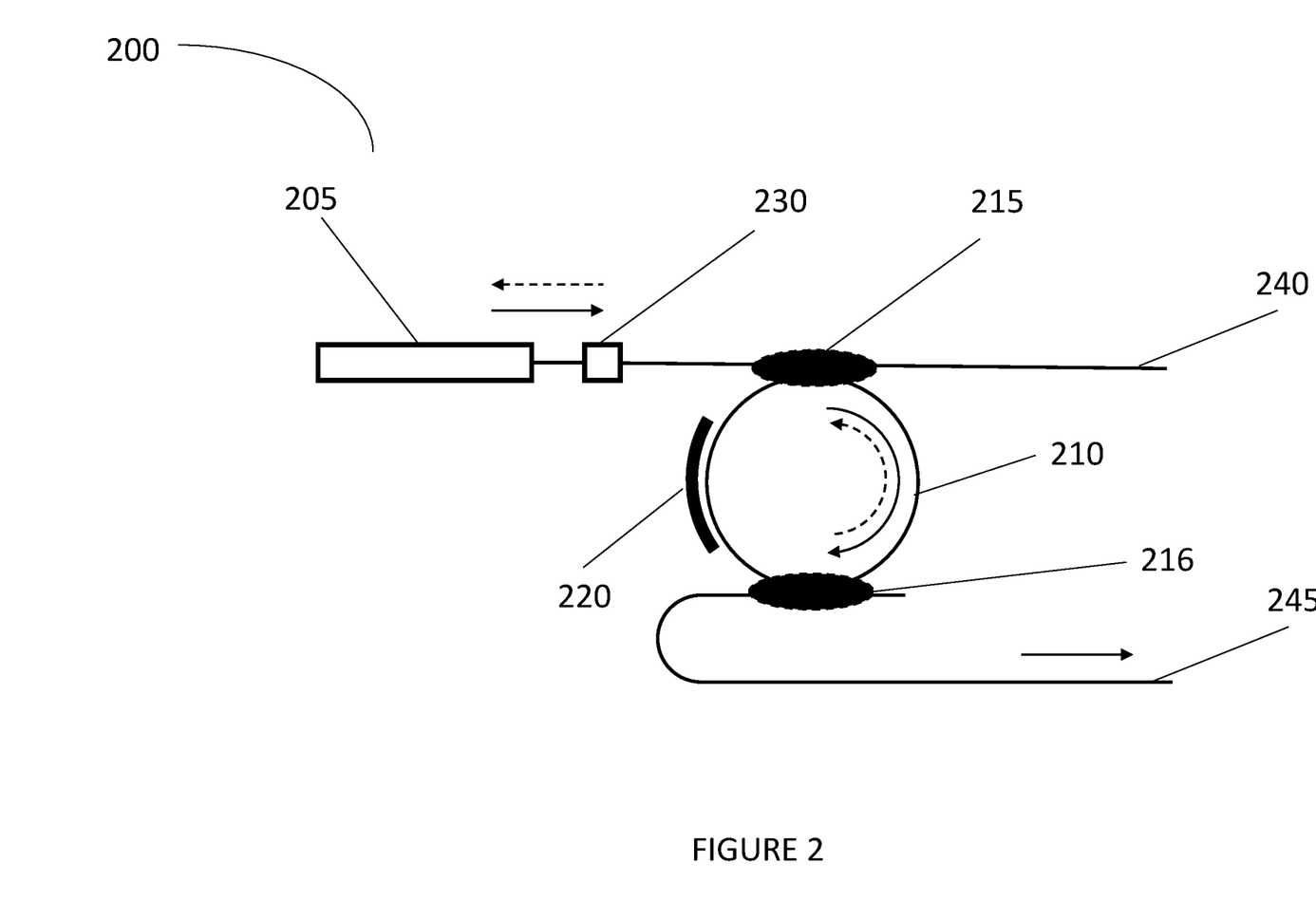
FIG. 2 shows a top-down view a device according to some embodiments of the present invention.

FIG. 2 shows a top-down view of one embodiment 200 of the current invention in which a semiconductor laser (or, parts of a semiconductor laser that at least provide optical gain functionality and one of the cavity mirrors) 205 is stabilized by injection-locking to (or, by forming a low noise laser by coupling to) a high-quality factor (high-Q) resonator 210. Element 205 is described in more detail with the help of FIG. 4 below. In contrast to FIG. 1 where the resonator is utilized in an all-pass configuration and the laser output is at 140, here the resonator 210 is utilized in an add-drop configuration and the primary laser output is at 245 while the secondary output 240 can optionally be used for monitor functionality. The difference in performance between all-pass and add-drop resonators is explained later with the help of FIG. 5. The add-drop resonator 210 is characterized by two coupler/splitter structures 215 and 216 whose splitting ratios are optimization parameters depending on propagation loss, coupler/splitter loss and other sources of loss inherent to the resonator. Depending on the level of noise and power desired to be achieved in the system, the ring resonator can be designed to operate in "under-coupled" or "over-coupled" regimes, terms known to those of skill in the art. For maximum noise reduction the high Q ring resonator is typically operated in an under-coupled regime, while for maximum laser output power the high Q ring resonator is typically operated in an over-coupled regime.

As the regime of operation (e.g. under-coupled, critically-coupled or over-coupled) depends both on the coupler/splitter coupling value, loss and the internal resonator losses including the propagation loss, in some embodiments the coupler/splitter structure 215 and 216 can be made tunable or adjustable. In this way, the resonator can be controlled to operate in the desired regime even if process variation is large. Tunable coupler/splitters can be made in various ways, including e.g. two couplers with phase control between at least one of the arms connecting them, piezo based or others.

The forward propagating (as indicated by solid-line arrows) light from laser 205 passes through phase control 230 and coupler/splitter 215 before reaching monitor output 240. Part of the light is coupled via coupler/splitter 215 to the resonator 210. This resonator can be a ring-resonator or other type of resonator providing add and drop port functionality. A small part of laser output is coupled via 215 to resonator 210 and, as discussed above for laser 100, there can be significant power buildup and storing of coherent photons where parts of the filtered, back-scattered light can be injected back into semiconductor laser 205 effectively stabilizing laser 205, improving both the RIN and phase/frequency noise. The level of backscattering can be engineered by introducing intentional scattering that can be broadband or frequency selective. This is typically done by introducing defects, non-periodic or periodic structures that can be discrete, distributed, pseudo-randomized and/or randomized. In this way the performance can be more deterministically engineered compared to using material and fabrication imperfection to provide backscattered signal as the latter largely depends on the fabrication process so can result with larger variation. In some other embodiments, the backscattering at splitter/coupler provides sufficient and controlled back-reflection.

Power build up in the resonator 210 means that the average power in the resonator can be significantly higher than the power that couples into the resonator each cycle. In other words, although only a small amount of forward propagating power couples into the resonator at splitter/coupler 215, due to very small losses in each roundtrip, that power can constructively accumulate at resonance resulting in significant average power buildup, and the amount of power that couples out again, after traveling around the resonator (in a clockwise direction in FIG. 2) can be of comparable value to the forward propagating light which travels directly from the laser and is not coupled into the resonator at all. If those two components of power are of opposite phase (a coupler/splitter typically introduces additional phase shift for cross-coupled light) they will interfere destructively resulting in only small amounts of power reaching output 240.

The situation is different at coupler/splitter 216 as there is no direct laser light interfering with power coupled out of the resonator, so greater amounts of signal are outcoupled and 245 acts as primary laser output power point. Phase tuner 230 and/or resonator tuner 220, corresponding to elements 130 and 120 in FIG. 1, serve the same purpose of optimizing the injection-locking and/or feedback conditions.

The light output at 245 is very stable, first because laser 205 has been stabilized by injection-locking by the optical light returned to it from the resonator 210, and then because of the additionally filtering action, the add-drop frequency response to be described below with reference to FIG. 5, of the resonator 210, significantly reducing both the amplitude and phase/frequency noise. The injection locking generally reduces the lower-frequency range noise, while the add-drop filter characteristics reduces the high-frequency range noise, which in combination can reduce the laser linewidth at output 245 by multiple orders of magnitude as will be described with the help of FIG. 5.

Figure 3:
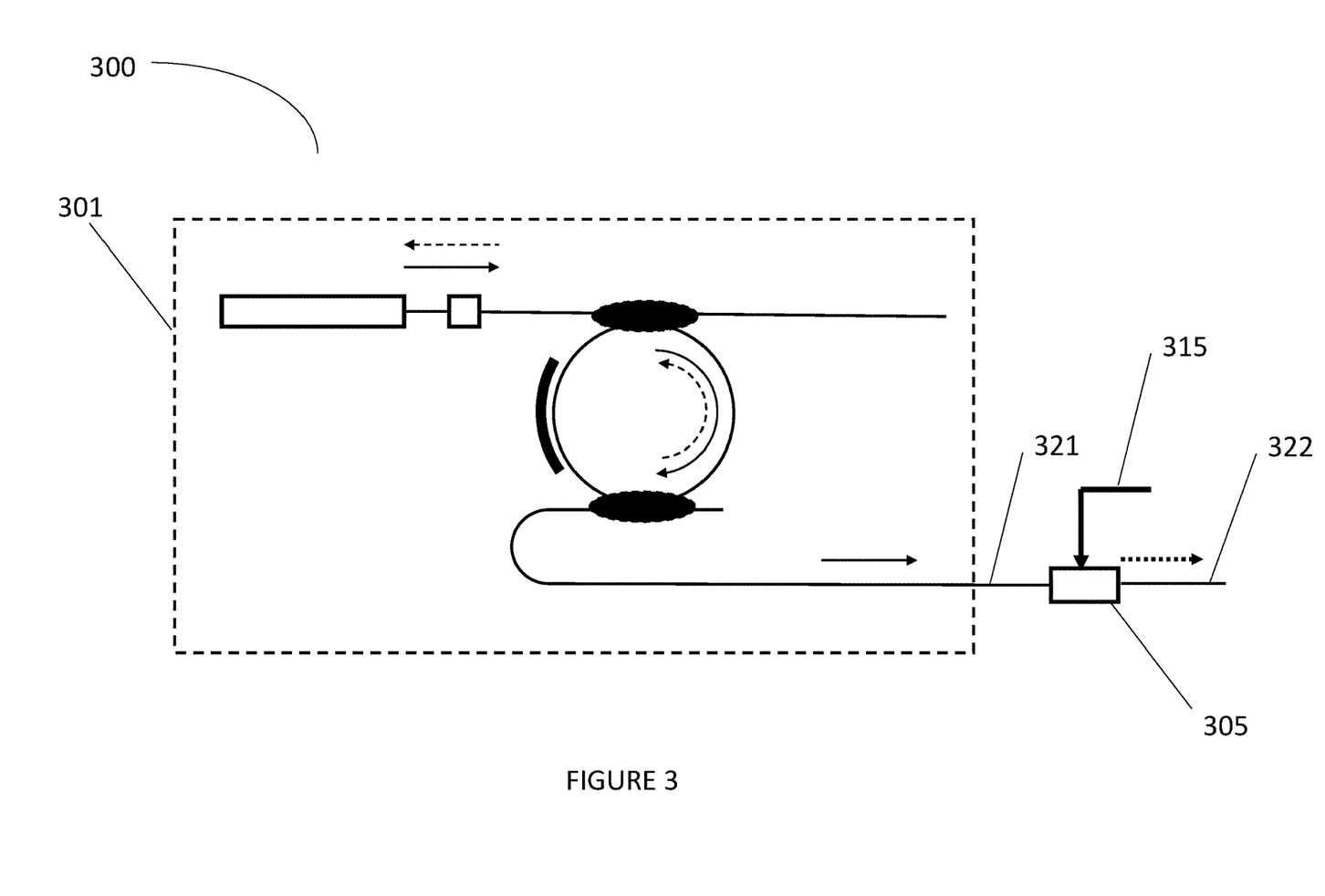
FIG. 3 shows a top-down view a device according to some embodiments of the present invention.

FIG. 3 shows a top-down view of one embodiment 300 of the current invention in which low noise laser 301 (essentially the same as apparatus 200 described in detail with respect to FIG. 2) is optically connected to modulator 305. Modulator 305 can be any type of common modulator, modulating amplitude, phase, or frequency, or it can be of a more advanced type providing e.g. both amplitude and phase modulation to enable utilization of higher-order modulation formats. Modulator 305 accepts the low-noise signal from low noise laser 301 as an optical carrier, and imprints data of interest 315 on the optical carrier producing signal 322 at the output. Additional optical components can be added (not shown) such as a pre-amplifier before the modulator, or a booster amplifier after the modulator, to control the output power. The control may include switching the output off without turning off the laser, preserving the low noise operation for applications requiring a fast switched source. In yet another embodiment, photodetectors can be connected to one or more laser outputs, or another splitter/coupler can be utilized to tap some amount of power to a photodetector. Such photodetectors can be used to provide easier control of the apparatus including the alignment between the laser and the resonator, control of the output power (e.g. constant output power across full operating temperature range) or others.

Figure 4:
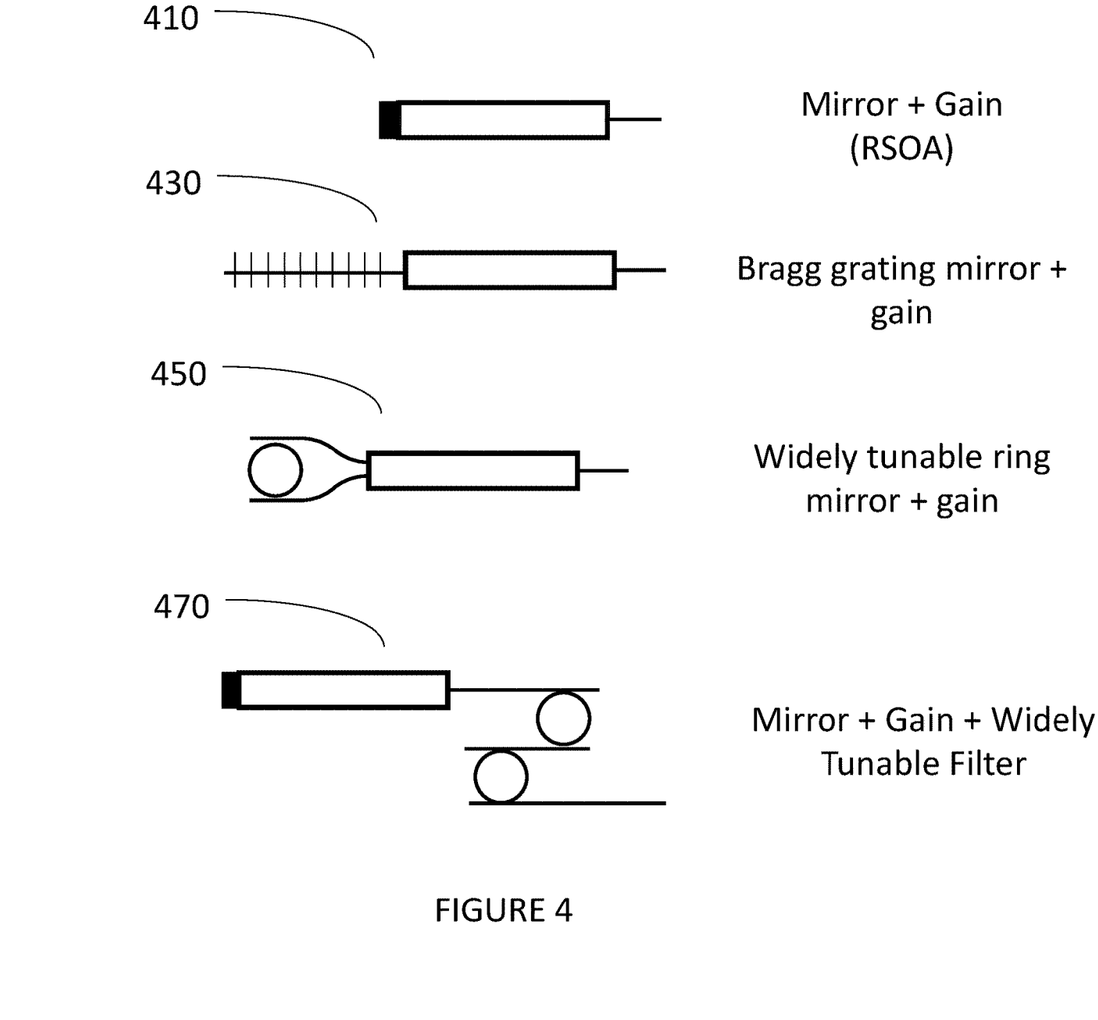
FIG. 4 shows a top-down view of elements of a device according to some embodiments of the present invention.

FIG. 4 shows some embodiments 410, 430, 450, 470 of the semiconductor laser 205 that may be used in apparatus 200. In other embodiments, not shown in FIG. 4, semiconductor laser 205 is a standalone semiconductor laser such as a distributed feedback (DFB) laser, distributed Bragg reflector (DBR) laser, widely tunable laser Fabry-Pérot and/or other type of standard commercial laser. A standalone semiconductor laser would provide lasing without interacting with other components, i.e. it comprises both the gain medium and the resonator (both mirrors) and the feedback from resonator 210 provides filtered laser light to be injected into the standalone laser to improve the noise performance.

In embodiments such as those shown in FIG. 4, semiconductor laser 205 utilizes one or more external components to close the laser cavity as illustrated with the help of FIG. 4. Each of the structures shown can be connected to resonator 210 to provide one of the mirrors necessary to form the full laser cavity. Examples of such structures include: (1) reflective semiconductor amplifier (RSOA) (410) comprising one broadband mirror and laser gain, (2) laser gain with one mirror formed by Bragg grating (430), (3) laser gain with one mirror formed by ring resonator (450) where this ring resonator, in some embodiments, can be tuned and (4) laser gain with one broadband mirror and one or more tunable ring resonators (470), and/or other types providing laser gain with at least one mirror with or without frequency selective elements such as gratings, ring resonators, Mach-Zehnder interferometers (MZIs) and/or other types of filters. In all such embodiments, the block 205 would not lase unless also optically coupled to resonator 210 whose back-reflection is used to form the second mirror. Resonator 210, being in effect a part of the whole laser cavity, provides a high-level of filtering inside the laser enhancing the performance and providing both low- and high-frequency filtering of laser noise at the output 245.

Figure 5:
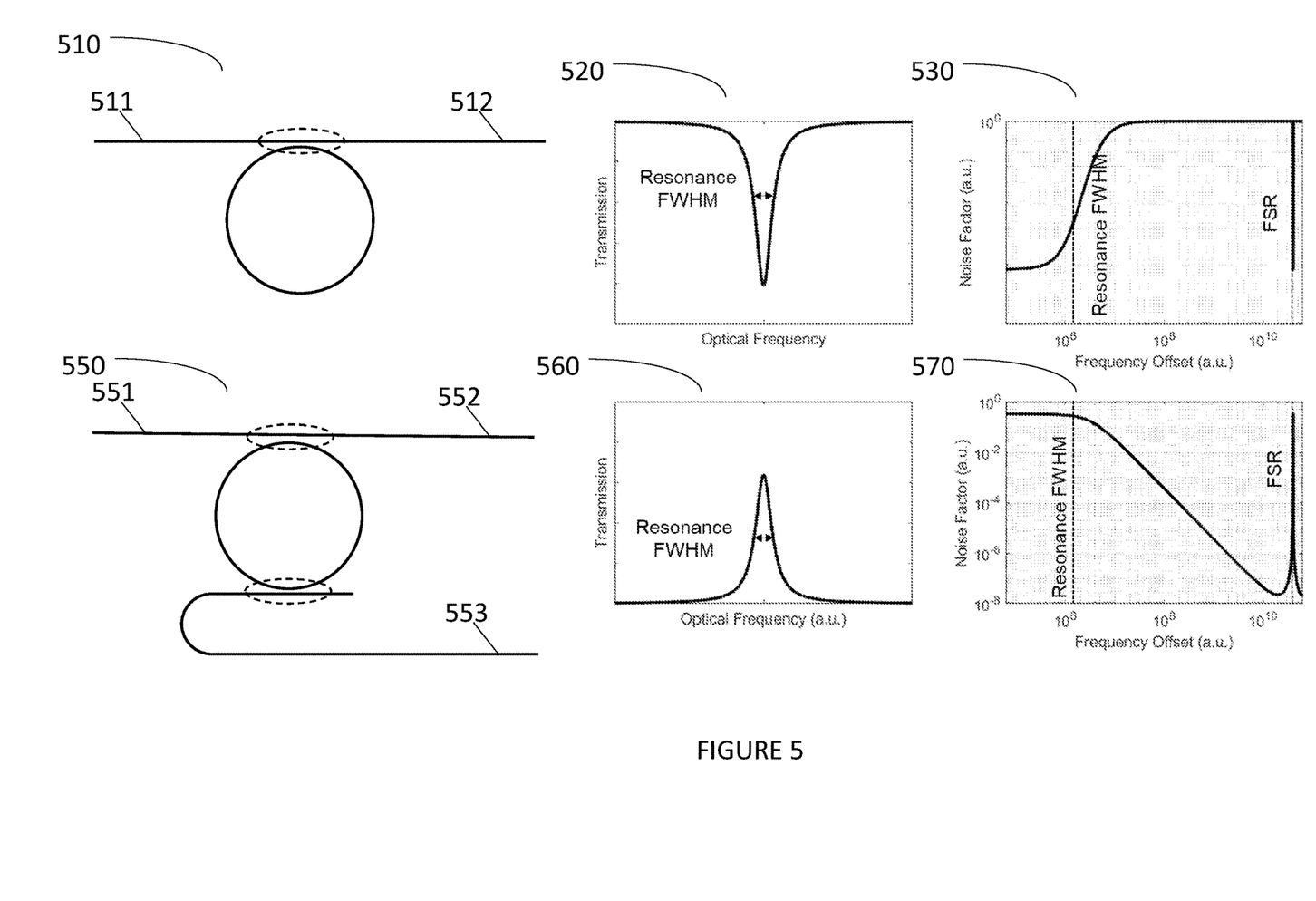
FIG. 5 illustrates two types of circular resonators in all-pass and add-drop configurations with simulation results illustrating the difference.

FIG. 5 illustrates the different noise filter responses of an all-pass filter 510 and an add-drop filter 550, and demonstrates the superiority of latter for applications requiring low noise lasers.

The optical transmission for all-pass filter 510, defined as the ratio of output 512 to input 511 is shown in 520. There is a transmission reduction at resonance, while other wavelengths are transmitted with no or very little attenuation. The full-width half-maximum (FWHM) of the resonance can be used to determine the Q factor which is the ratio of the resonance frequency and the FWHM bandwidth of the resonance". The effect on noise suppression can be expressed as noise factor which we define as the ratio of the output noise to the input noise. A noise factor of 1 indicates no addition or suppression of noise; a noise factor smaller than 1 indicates noise suppression.

For an all-pass filter 510, a typical plot of noise factor (or normalized optical transmission) as a function of frequency offset from the resonant frequency is shown in 530. The noise factor is shown to have a minimum value, well below 1, at the resonant frequency, meaning that a significant amount of low-frequency noise suppression or filtering is provided. The exact value of the noise factor will depend on the Q factor of the resonator and on loading), but the dependence of the noise factor on offset frequency means that the value rises—so the effect of noise filtering is reduced—as offset frequency is increased up to and beyond the resonance FWHM, and vanishes as offset frequency is further increased and approaches the resonator's free spectral range (FSR) for the first time, where the noise factor reaches 1. When the offset frequency increases beyond the resonator's FSR, the same pattern of noise filtering behavior repeats[1] through the next FSR, and so on, due to the same effect of adjacent resonant modes. A self-injection locked laser based on an all-pass filter, therefore, would feature a sharp rise of the noise level at offset frequencies sufficiently higher than the resonance FWHM—which typically ranges from MHz to GHz level for high-Q resonators.

[1]The logarithmic horizontal scale compresses the shape of the illustrated curve.

In contrast to plot 520 for an all-pass filter 510, the optical transmission for an add-drop filter 550, defined as the ratio of output 553 to input 551, is shown in 560. There is maximum transmission at resonance, while the transmission is significantly reduced at other wavelengths and approaches very low values at optical frequencies sufficiently different from the resonance frequency. For an add-drop filter 550, the noise factor as a function of frequency offset from the resonant frequency is plotted in 570. Add-drop filter 510 can provide some low-frequency noise filtering even at the resonant frequency (the exact amount depending as before on filter Q factor and loading), but the magnitude of this filtering increases substantially as offset frequency increases. The noise filter approaches 0 as the offset frequency approaches the resonator's FSR for the first time, meaning that noise filtering is maximized. When the offset frequency increases beyond the resonator's first FSR, the noise filtering action resets and the pattern repeats for the next FSR. A self-injection locked laser based on the add-drop filter, therefore, would have the noise well suppressed through the entire frequency span between adjacent FSRs, outperforming the noise performance at high frequency range of lasers injection locked to all-pass filters.

The response of add-drop filter 550 on secondary output 552 is very similar to the response of all-pass filter 510 on output 512 as described above.

The effect of the noise factor on the output of apparatus 200 applies to both the intensity (RIN) noise and phase/frequency noise, and with high-Q resonators can reduce resulting output laser noise by multiple orders of magnitude, correspondingly reducing the linewidth by the same amount. With high-Q resonators, laser linewidth can be reduced from 100 kHz-1 MHz range for standalone lasers down to Hz levels or below.

Figure 6A:
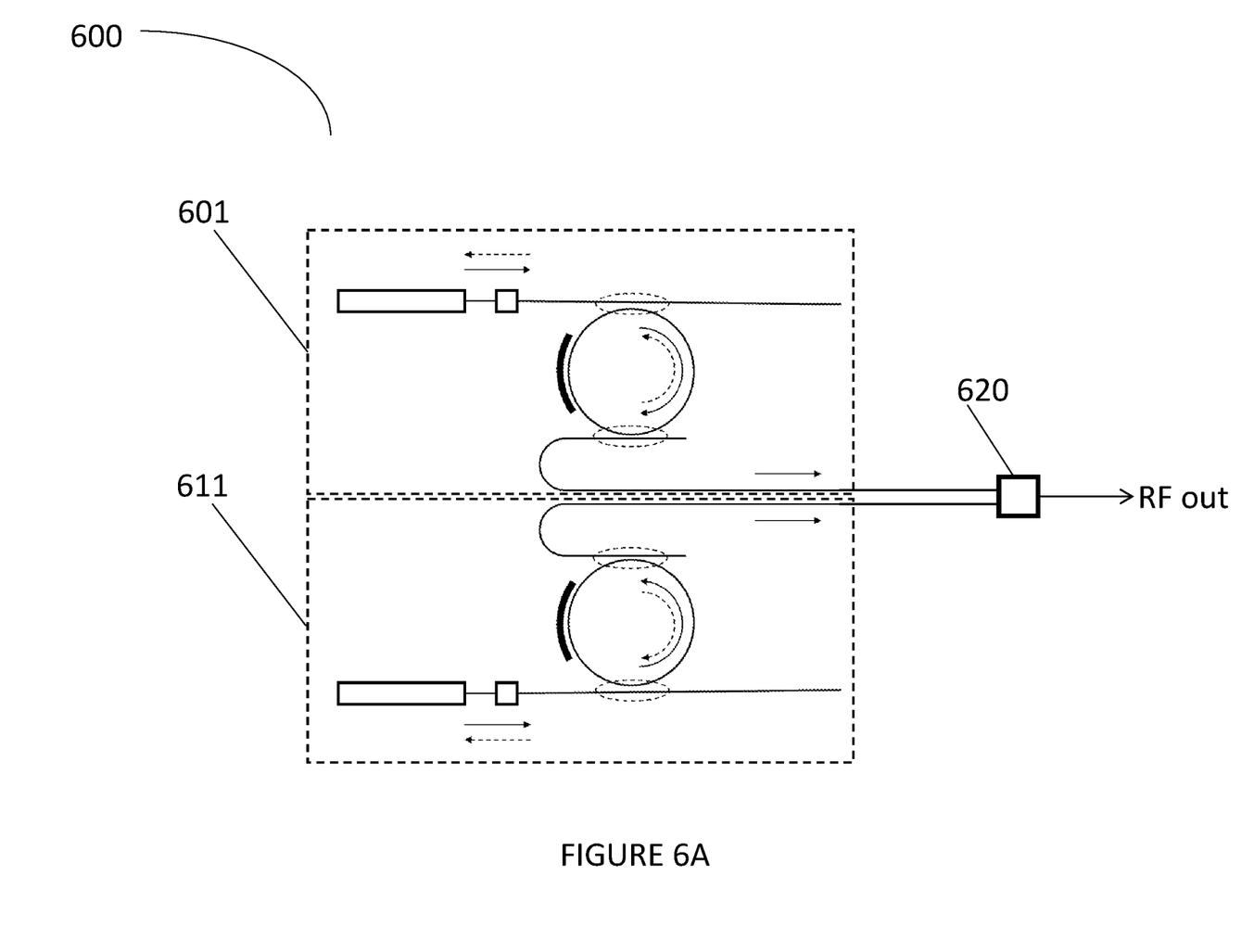
FIG. 6A shows a top-down view of a device according to some embodiments of the present invention.

FIG. 6A shows one embodiment 600 of a device according to the present invention that comprises two low noise lasers 601 and 611 (corresponding to 200 in FIG. 2), each of which can comprise additional functionality with components (not shown) such as modulators, amplifiers, or photodetectors as described above with respect to FIG. 3. Two or more such lasers are coupled to element 620—typically one or more high-speed photodetectors, photo-mixers, or a combination of both—where a high-speed RF signal is generated. The frequency of the RF signal is equal to the difference in optical frequencies of optical sources 601 and 602, and the linewidth/phase noise of the RF signal is equal to the convolution of the two optical signal linewidths. It is evident that for high quality (low noise) RF signals, very low noise optical sources are needed.

In some embodiments of device 600 high-frequency signals may be generated at the element 620. In other embodiments, a modulator (not shown in the figure for simplicity, but see element 305 of FIG. 3 for a possible implementation) may be present in one or both optical paths leaving lasers 601 and 611, imprinting a high-bandwidth signal on the corresponding optical frequency. Mixing of the two optical carriers at element 620 will then generate a down-converted signal RF signal that conveys the desired information that was modulated onto one or both optical carrier frequencies This enables transmission of ultra-high bandwidth RF signals at long distances using optical carriers and optical fiber and/or free space, removing the high propagation loss limitation commonly associated with electrical cables at very high frequencies.

Figure 6B:
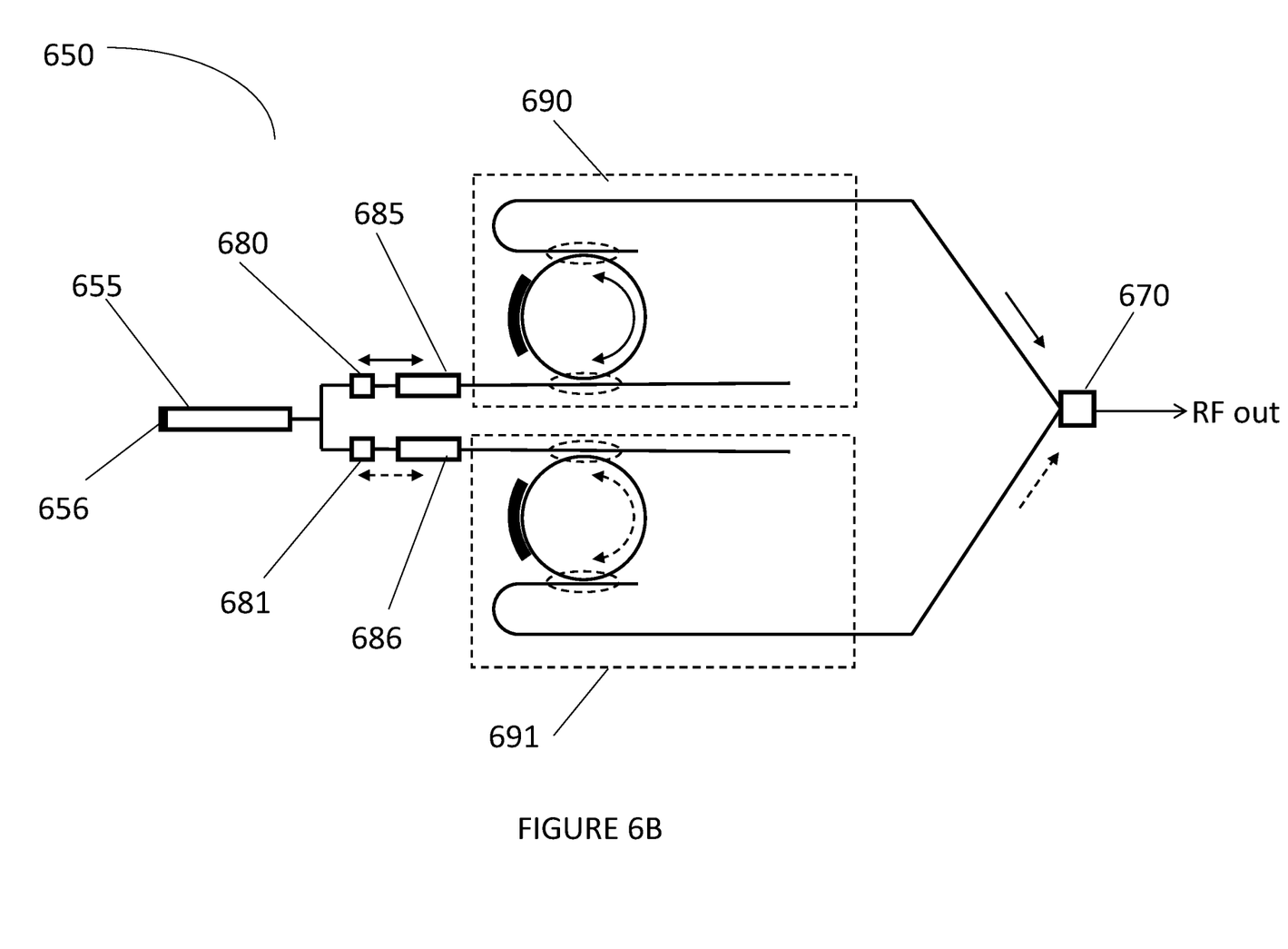
FIG. 6B shows a top-down view of a device according to some other embodiments of the present invention.

FIG. 6B shows yet another embodiment 650 of a device according to the present invention that comprises two low noise lasers that share a common gain material 655 comprising single mirror functionality 656. In one of the embodiments, gain material 655 is quantum dot based. Quantum dots have significantly reduced gain competition and provide higher stability of simultaneous lasing at two or more wavelengths using a single gain region. The output from gain material 655 is split into two parts, and two separate laser cavities are formed, not separately outlined in the figure for simplicity. The first cavity includes a phase control element (680) and a frequency-selective filter 685, providing control of the first lasing wavelength. The first cavity is coupled to first add-drop resonator 690, which provides mirror functionality (the second "mirror") for the first laser cavity. Various types of frequency-selective filters can be utilized, some of which are listed above in the description of FIG. 4, such as ring-resonators, gratings and/or others. The second cavity includes a phase control element (681) and a frequency-selective filter 686 providing control of the second lasing wavelength. The second cavity is coupled to second add-drop resonator 691 which provides mirror functionality to the second laser cavity. The two laser outputs are coupled to element 670 (one or more high-speed photodetectors and/or photomixers) where high-speed RF signals are generated as explained above in relation to element 620 in FIG. 6A. One or both of the frequency-selective filters 685 and 686 can be made tunable.

Some embodiments of the present invention can be assembled from various fiber-pigtailed components where connections are made with splices or common optical connectors. In some embodiments, elements providing parts of the functionality are integrated in PICs that can be made in various platforms. The PICs are then fiber pigtailed or assembled on a common carrier, with the latter approach providing size reduction. Particular functionalities can be implemented in different technologies or platforms, e.g. semiconductor laser is made in GaAs, InP, GaN or other common semiconductor platforms for making optical sources, while the resonators are made in Si, SiN, LiNbO3 or other common platforms used for providing high-quality planar resonators. Use of multiple material systems allows for better performance of individual devices.

In yet another embodiment, the whole functionality of apparatus 200, 300, 600 and/or 650 is made on a common carrier using heterogeneous integration, where pieces, dies or whole wafers are bonded and then processed using common lithography alignment marks as e.g. described in e.g. H. Park "Integrated active devices with improved optical coupling to dielectric waveguides", U.S. Pat. No. 10,718,898 and/or H. Park "Integrated active devices with improved optical coupling to planarized dielectric waveguides", U.S. Pat. No. 10,641,959. Heterogeneous integration, as described in above references, enables efficient integration between common materials used for making optical sources and common materials used for waveguides and resonators.

Figure 7:
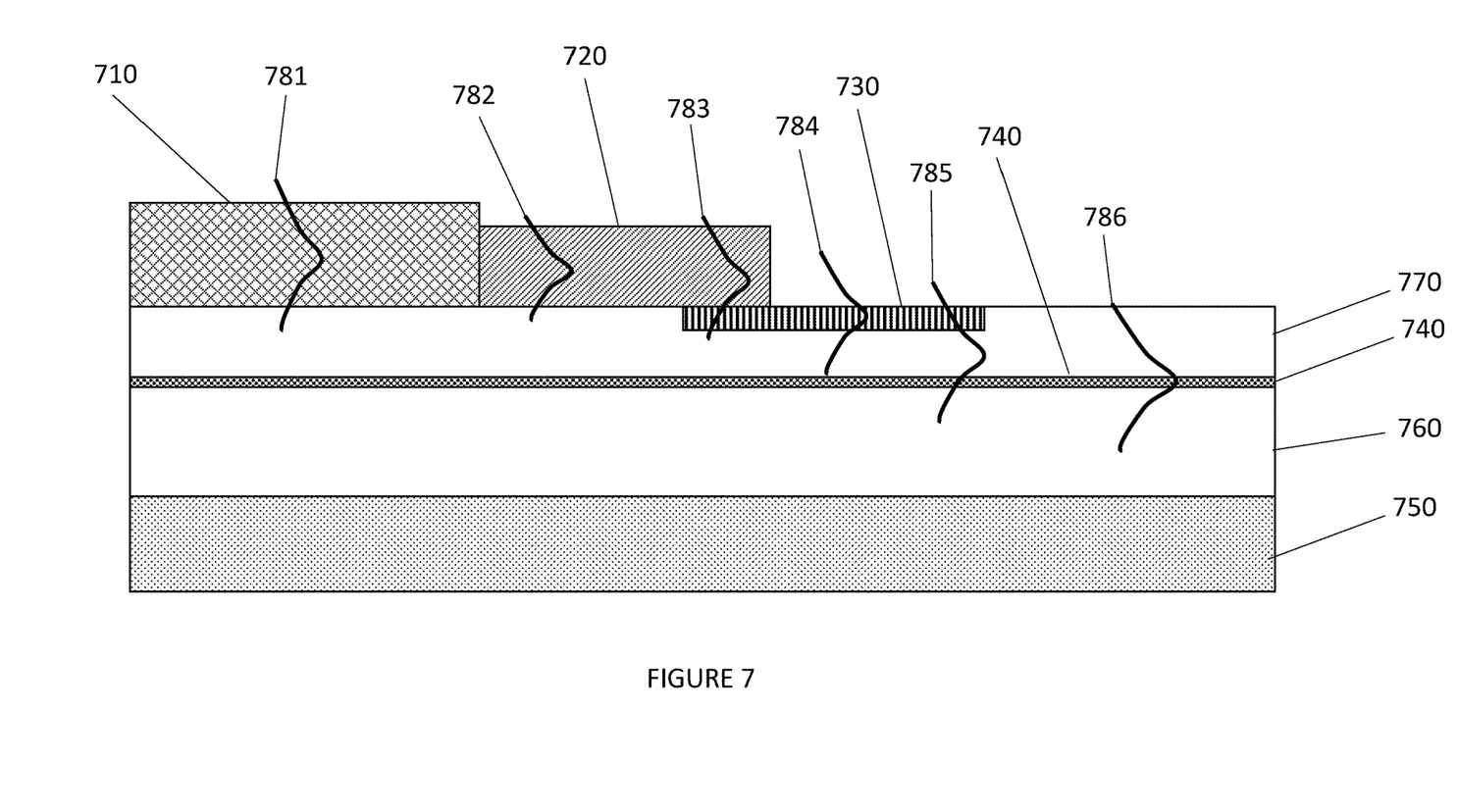
FIG. 7 shows a cross-sectional view of a device made in heterogeneous integration technology according to some embodiments of the present invention.

FIG. 7 shows a cross-section of heterogeneous photonic integrated circuit platform providing optimized performance for apparatuses described in this disclosure. This is just one example, illustrative of how devices according the present invention may be practically fabricated and incorporated into more complex photonic integrated circuits.

One key consideration is the layer in which the one or more high Q resonators of the present invention may be fabricated. This layer—layer 740 in FIG. 7—has to meet specific requirements on the waveguide geometry, specifically to have very low propagation loss, it typically requires reduced thickness (actual thickness depends on wavelength of operation and is in the range of 40-150 nm for e.g. 1550 nm or is in the range of 10-80 nm for e.g. 400 nm operation).

It is typically challenging to optically couple layer 740, providing high-Q resonator functionality, directly to layer 710 providing active functionality (optical gain, modulation, detection) due to significant difference in their optical mode size. To facilitate more efficient coupling, optical mode 786 supported in 740 can first be adiabatically transformed by taper structures to optical mode 785 and finally optical mode 784 supported by second waveguide layer 730. Second waveguide layer 730 generally provides higher optical confinement than the first waveguide layer 740 due to higher refractive index and/or larger waveguide core cross-section. Coupling between mode 784 supported by second waveguide layer and optical mode 781 supported by layer 710 is facilitated by edge coupling as described in e.g. H. Park "Integrated active devices with improved optical coupling to dielectric waveguides: U.S. Pat. No. 10,718,898 and/or H. Park "Integrated active devices with improved optical coupling to planarized dielectric waveguides", U.S. Pat. No. 10,641,959, referenced above.

The optical mode is first adiabatically transformed to mode 783 and finally mode 782 supported by intermediate waveguide formed by layer 720 with final transition between modes 782 and 781 supported by layer 710 is facilitated by butt-coupling. The optical coupling process is reciprocal so transition from 781→786 follows same steps. Additional cladding layers (not shown) might be deposited to reduce propagation loss and protect the waveguides. Additional processing steps, such as metal deposition, liftoff, passivation, etc might be introduced to form the active structures including the laser. Other active devices, such as modulators, photodetectors, phase shifters can be integrated in the same way. In the cross-section shown in FIG. 7, substrate 750 can be any type of material typically used for making wafers such as silicon, sapphire, fused silica, lithium-niobate, other types of glass, other dielectrics and/or semiconductors. Layer 740, deposited, bonded or otherwise attached to substrate 750, is made up of one or more materials such as Si, SiN, LiNbO3, Ta2O5, Al2O3 etc. If the refractive index of layer 740 is lower than the refractive index of layer 750, an optional layer 760 having lower refractive index than 740 and providing cladding functionality can be deposited prior to layer 740. Layer 740 can be patterned to define optical functionality before upper cladding layer 770 is deposited. Layer 770 has lower refractive index than both layer 740 and layer 730.

Embodiments of the semiconductor lasers described herein may be incorporated into various other devices and systems including, but not limited to, various optical networks, various computing and/or consumer electronic devices/appliances, communication systems, sensors and sensing systems.

It is to be understood that the disclosure teaches just a few examples and illustrative embodiments, that many variations of the invention can easily be devised by those skilled in the art after reading this disclosure, and that the scope of the present invention is to be determined by the following claims.

The invention claimed is:

1. One or more devices, each device comprising:
first, second and third elements; wherein
  the first element, comprising an optical gain structure and at least one laser cavity mirror structure, couples light to the second element;
  the second element, comprising a phase tuner, couples phase tuned light to the third element; and
  the third element, comprising an optical resonator with first and second coupler/splitter structures provides a primary optical output exiting the device;
wherein light coupled into the optical resonator through the first coupler/splitter structure and then coupled out of the optical resonator though the first coupler/splitter structure is injected back into the optical gain structure through the second element;
wherein light reaching the second coupler/splitter structure after passage through the first coupler/splitter structure is split into first and second outputs, the first output being coupled back into the resonator, and the second output being coupled out of the optical resonator as the primary optical output exiting the device, no portion of the primary optical output being fed back into the resonator; and
wherein characteristic of the first and second coupler/splitter structures and the optical resonator are selected such that the light injected back into the optical gain structure reduces linewidth, and noise in primary optical output is suppressed.

2. The one or more devices of claim 1,
wherein the optical resonator in each device is tunable.

3. The one or more devices of claim 1,
wherein at least one of the first and second coupler/splitter structures in each device is tunable.

4. The one or more devices of claim 1,
wherein the optical resonator in each device comprises periodic structures (such as Bragg gratings) to provide additional spectral selectivity.

5. The one or more devices of claim 1,
wherein the third element in each device provides a secondary optical output from the first coupler/splitter structure, the secondary optical output allowing monitoring and operations control of that device.

6. The one or more devices of claim 1, each device additionally comprising:
a fourth element, receiving the primary optical output, the fourth element comprising a structure providing modulation functionality.

7. The one or more devices of claim 1,
wherein the first element in each device is a distributed feedback laser.

8. The one or more devices of claim 1,
wherein the first element in each device is a reflective semiconductor optical amplifier.

9. The one or more devices of claim 1,
wherein the first element is each device is an optical gain structure coupled to a resonant mirror.

10. The one or more devices of claim 9,
wherein the resonant mirror is a distributed Bragg reflector.

11. The one or more devices of claim 1,
wherein the first element in each device comprises an optical gain structure and at least one of a tunable ring resonator, a Mach-Zehnder interferometer, a Bragg grating, a sampled Bragg grating, and a loop mirror.

12. The one or more devices of claim 1,
wherein the first element in each device comprises an optical gain structure, a broadband optical mirror, and a tunable ring resonator in add-drop configuration.

13. The one or more devices of claim 1,
wherein the one or more devices comprise:
a first device optically coupled to a fifth element; and
a second device optically coupled to the fifth element;
wherein the fifth element comprises a structure providing photodetector functionality; and
wherein the primary optical output signal provided by the first device is optically mixed at the fifth element with the primary optical output signal provided by the second device, and down-converted to a lower frequency signal.

14. The one or more devices of claim 1,
wherein the one or more devices comprise:
a first device optically coupled to a fifth element to provide the primary optical output of the first device thereto; and
a second device optically coupled to the fifth element through an intervening modulator that imprints RF modulation on the primary optical output of the second device; and
wherein the fifth element comprises a structure providing photodetector functionality, such that optical mixing of the primary optical output from the first device and the modulated primary optical output from the second device at the fifth element generates a down-converted RF signal.

15. A device comprising:
first, second, third, fourth, fifth, sixth, seventh and eight elements that are optically coupled;
a first element comprising an optical gain structure and one laser cavity mirror structure;
a second element and a third element, each comprising a phase tuner;
a fourth element and a fifth element, each comprising a frequency-selective filter;
a sixth element comprising a first optical resonator with first and second coupler/splitter structures;
a seventh element comprising a second optical resonator with third and fourth coupler/splitter structures; and
an eighth element, comprising a structure providing photodetector functionality, the eighth element being optically coupled to first and second resonators through the second and fourth coupler/splitter structures;
wherein first, second, fourth and sixth elements cooperate to form a first laser cavity, and light coupled into the first optical resonator through the first coupler/splitter structure is injected back into the optical gain structure of the first element through the fourth and second elements;
wherein first, third, fifth and seventh elements cooperate to form a second laser cavity, and light coupled into the second optical resonator through the third coupler/splitter structure is injected back into the optical gain structure of the first element through the fifth and third elements;
wherein a first optical signal outputted from the first laser cavity through the second coupler/splitter structure and a second optical signal output from the second laser cavity through the fourth coupler/splitter structure are optically mixed and down-converted to lower frequencies at the eighth element; and
wherein characteristic of the first, second, third and fourth coupler/splitter structures and the first and second optical resonators are selected such that the light injected back into the optical gain structure suppresses noise in the first and second optical signals.

16. The device of claim 15,
wherein the optical gain structure is based on quantum dots.

17. The device of claim 15,
wherein the first and second optical resonators are tunable.

18. The device of claim 15,
wherein the frequency selective structures in the fourth and fifth elements are tunable.

* * * * *